United States Patent [19]

Avery

[11] Patent Number: 5,548,135
[45] Date of Patent: Aug. 20, 1996

[54] ELECTROSTATIC DISCHARGE PROTECTION FOR AN ARRAY OF MACRO CELLS

[75] Inventor: Leslie R. Avery, Flemington, N.J.

[73] Assignee: David Sarnoff Research Center, Inc., Del.

[21] Appl. No.: 439,929

[22] Filed: May 12, 1995

[51] Int. Cl.⁶ .......................... H01L 29/74; H01L 31/111
[52] U.S. Cl. ............................................ 257/173; 257/161
[58] Field of Search .................................. 257/173, 112, 257/121, 161

[56] References Cited

U.S. PATENT DOCUMENTS

| 5,043,782 | 8/1991 | Avery | 357/23.13 |
| 5,311,391 | 5/1994 | Dungan et al. | 361/56 |
| 5,336,908 | 8/1994 | Roberts | 257/173 |
| 5,343,053 | 8/1994 | Avery | 257/173 |
| 5,361,185 | 11/1994 | Yu | 257/112 |

*Primary Examiner*—Stephen D. Meier
*Attorney, Agent, or Firm*—William J. Burke

[57] ABSTRACT

An electrostatic discharge (ESD) protection circuit for an integrated circuit formed of a plurality of individual circuit cells which are connected to form the desired circuit. A pair of buss lines, preferably in closely spaced relation, extend about the circuit formed by the circuit cells. A plurality of ESD protection circuits are electrically connected between the buss lines in a spaced apart relationship, preferably in a closed in a close relationship to the electrical connections of the circuit cells to be protected.

13 Claims, 5 Drawing Sheets

ELECTROSTATIC DISCHARGE PROTECTION FOR AN ARRAY OF MACRO CELLS

The present invention relates to electrostatic discharge (ESD) protection of an array of individual circuit cells such as the core logic macrocells of an integrated circuit.

BACKGROUND OF THE INVENTION

Many electrical circuits, particularly those which include MOS transistors, are subject to being damaged by electrostatic discharge (ESD). To overcome this problem, ESD protection circuits have been developed for various types of circuitry. For example, see my U.S. Pat. No. 5,043,782 and my U.S. Pat. No. 5,343,053 and my pending U.S. patent application Ser. No. 08/291,809, each of which is incorporated herein by reference, are particularly applicable to protection of ICs from ESD on the power buss.

To date, ESD protection schemes have addressed the input, output and power ports of an integrated circuit (IC). However, as ICs have grown in size and complexity, and device geometries have shrunk, ESD damage to interconnected array of individual cells, such as an array of macrocells forming core logic circuitry, has become more prevalent. This has been addressed in new designs by adding power supply ESD protection structures to the macrocells' power lines, and providing ESD protection between the input/output (I/O) circuits around the periphery of the IC and the I/O ports of the macro logic cells. Once such a circuit is designed with the various macrocells, such as logic cells, being arranged in a manner so as to form a compact overall device, it is difficult to provide each individual macrocell with power supply ESD protection circuits without a substantial layout effort involving redesign of the logic macrocells, increasing the overall size of the device. In addition, adequate ESD protection for core logic circuitry as a whole requires the application of a set of rules which are often difficult to check using automatic computer routines. Currently, an engineer who is knowledgeable in the art is required to check such a chip layout. Thus, it would be desirable to have a technique for providing the core logic circuits of a large integrated circuit with ESD protection for the core logic circuits as a whole block in a manner in which it is easily computer checked rather than trying to protect each macrocell.

SUMMARY OF THE INVENTION

A circuit having electrostatic discharge (ESD) protection for an array of individual circuit cells arranged in relation to one another includes a pair of conductive buss lines extending about the array of individual circuit cells. Means are provided for connecting the array of individual circuit cells to the buss lines. A plurality of ESD protection circuits electrically connected between the buss lines in a spaced apart relationship.

BRIEF DESCRIPTION OF THE DRAWING

In the Drawing like items are identified by the same reference numeral and.

DETAILED DESCRIPTION

Figure 1:
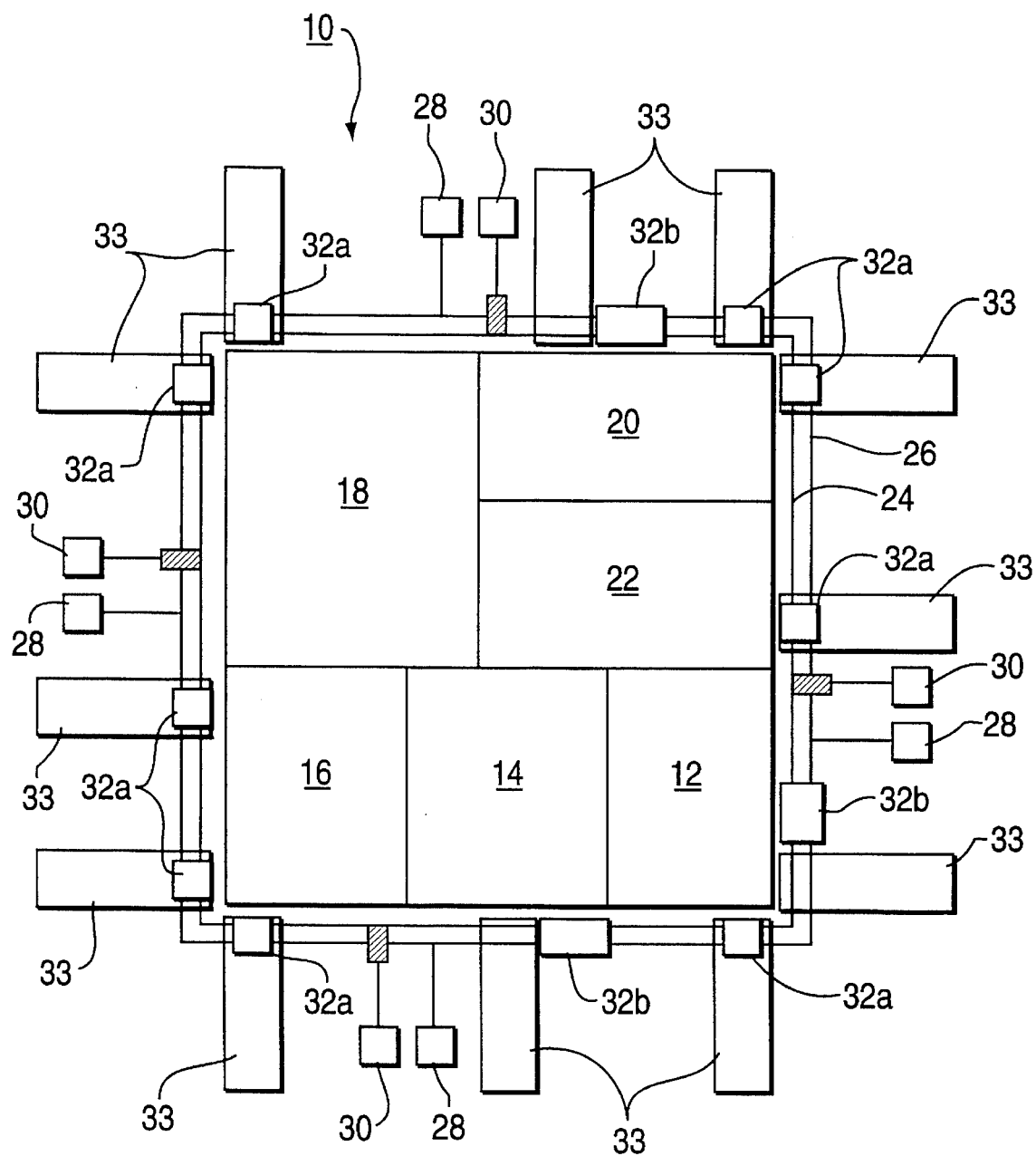
FIG. 1 is a top schematic view of an arrangement of a plurality of individual circuit cells of an IC which incorporates ESD protection circuits in accordance with the invention.

In FIG. 1, there is schematically shown a circuit, such as a core logic block (circuit block), which is generally designated as 10. The circuit 10 is made up of a number of different individual cells (macrocells) 12, 14, 16, 18, 20 and 22 which are arranged and electrically interconnected in a compact relation on a substrate (not shown). It is not necessary that all cells be connected to one another. The individual circuits may include such functional cells as gates, flipflops, registers, memory, amplifiers, etc. interconnected to form macrocells such as CPUs, ALUs, RAMs, ROMs, MCMs, buss address and buss contention macrocells and other well known cells. A pair of conductive buss lines 24 and 26 extend about, and preferably completely around, the cells 12–22 of the circuit 10, preferably in a slightly spaced apart and substantially parallel relation. One of the buss lines, such as the buss line 24, is a power line, and the other buss line 26 is connected to a source of reference potential, for example to a ground line. The internal buss circuits of the various cells 12–22 of the circuit 10 are electrically connected to the buss lines 24 and 26. Power pads 28 and 30 are electrically connected to the buss lines 24 and 26, and positioned in spaced apart relation along the buss lines for connecting the buss lines to a power source. One power pad of each pair is electrically connected to one of the buss lines and the other power pad of each pair being electrically connected to the other buss line.

Figure 2:
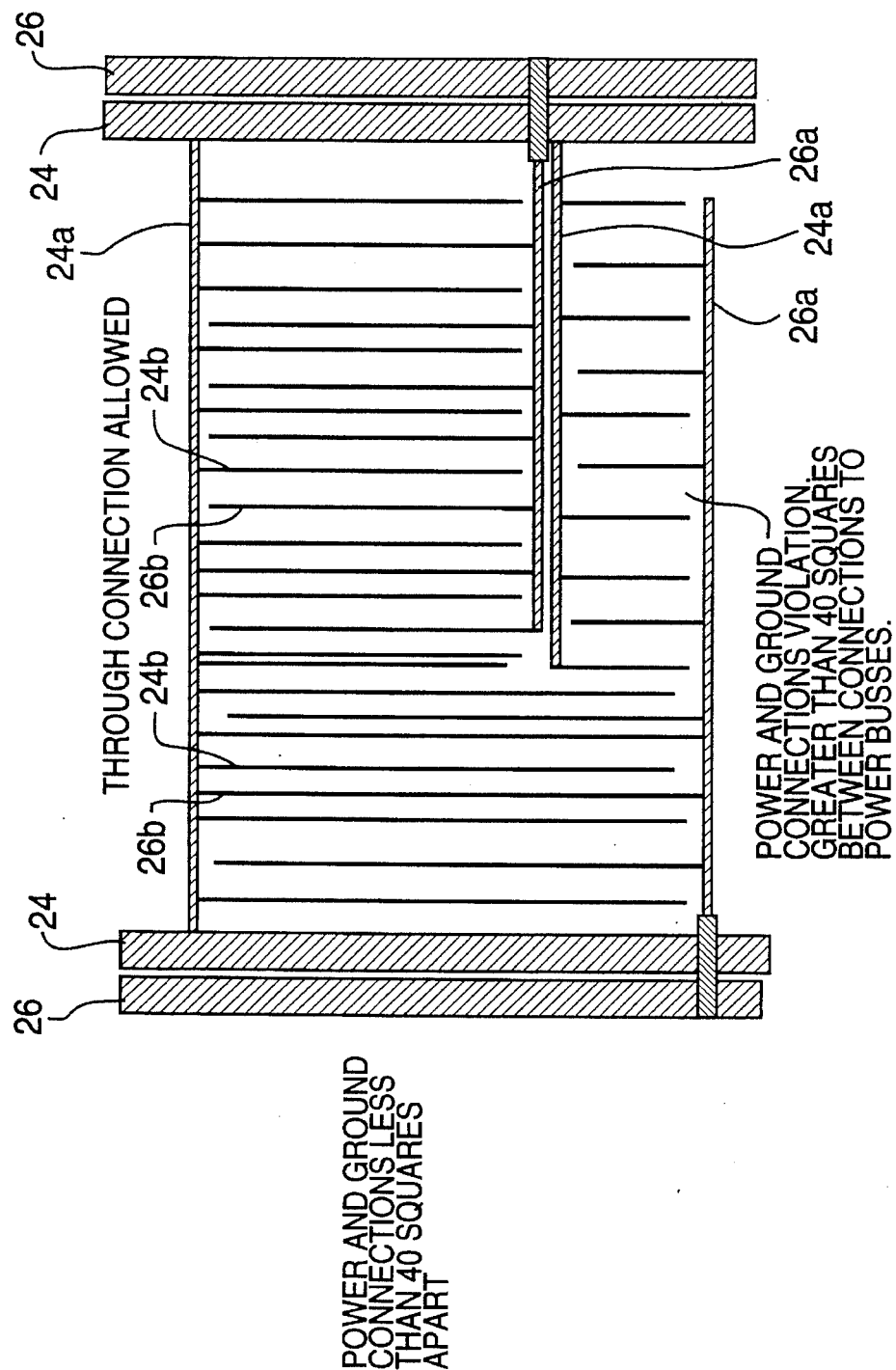
FIG. 2 is a top schematic view illustrating acceptable connections between the power busses and the macrocells.

The buss lines preferably, though not necessarily, should completely surround the array of individual circuit cells. Other arrangements of the buss lines selected once the layout of the individual cells is known are equally acceptable as shown in FIG. 2. For ESD purposes, the minimum final width the busses 24 and 26 should be at least 20 micrometers. The actual width may be more dominated by power line need considerations due to logic switching. Also, on very large chips, the width of the buss lines 24 and 26 may need adjustment to maintain a maximum resistance of ten ohms between power connections to the busses 24 and 26. This corresponds to about 200 squares of metal at fifty milliohms per square. Metal connections between the macrocells and the power buss, 24a and 26a, respectively, should be as close together as possible. There should be no more than the equivalent of two ohms of macrocell power buss metal (less than 40 squares) between the power and ground busses to the same macrocell. It is not allowed to connect the power and ground terminals of the same macrocell to opposite sides of the chip unless the power busses to the macrocell also run from one side of the chip to the other. This is illustrated in FIG. 2. Also in FIG. 2, internal cells busses to provide voltage to the individual devices comprising the cell are designated as 24b and 26b respectively.

Figure 3:
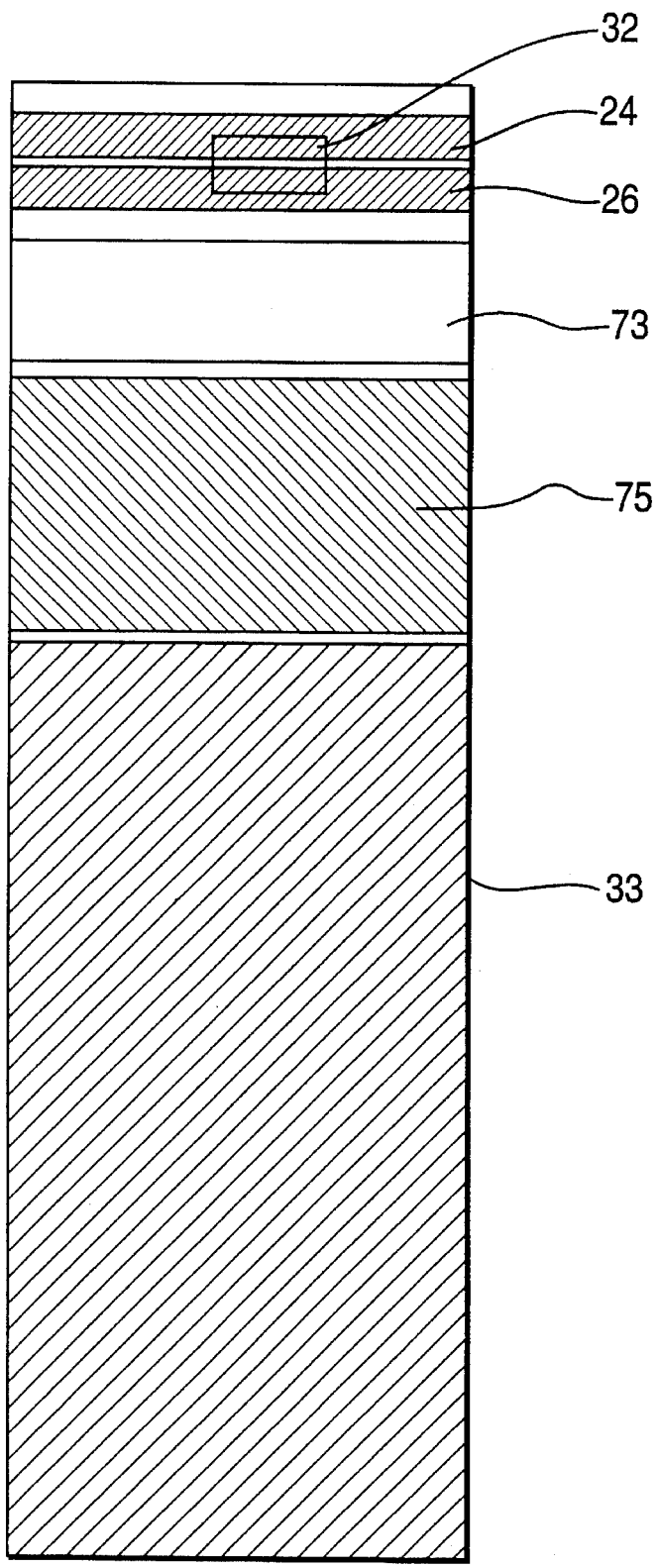
FIG. 3 is a schematic diagram of an I/O cell incorporating the macrocell power busses.

A plurality of ESD protection circuits 32 are formed between the buss lines 24 and 26 at various positions about the circuit 10 in a spaced apart relationship. For example, in FIG. 1 the numeral 32a designates protection circuits integral with the I/O pads 33, as discussed below, and 32b designates protection circuits close to the I/O pads. Each of the ESD circuits 32 is preferably positioned closely spaced to, and preferably adjacent to, the electrical connections of one of the circuit cells to the buss line of one of the cells 12–24 which is to protected by the particular ESD circuit 32. There may be more than one ESD circuit 32 closely spaced to a particular one of the cells 12–24. The ESD circuits 32 are electrically connected to the buss lines 24 and 26 so that they clamp any ESD transient between the buss lines 24 and 26 to a voltage level below that necessary to cause damage to the cell 12–22 connected to the buss lines. Since the ESD currents can be several amperes connection between the internal buss lines of a macrocell and the ESD protection circuits should be as close as possible to minimize the buss line voltage drops being added to the cell clamping voltage and preferably they can be part of the I/O pad as illustrated in FIG. 3. By forming the ESD circuits 32 between the buss lines 24 and 26, the ESD circuits 32 can be added to a predesigned core logic circuit block without changing the overall design of the circuit 10 and individual macrocells 12 through 24 and without substantially increasing the overall size of the circuit.

IN FIG. 3, the pad I/O cells 33 incorporate the sync/interface cells 75 and a wiring channel cell 73 which preferably includes power and ground busses 24 and 26, respectively, for the core macrocell. The wiring channel 73 is expandable to accommodate the required number of interconnections. In this arrangement the ESD protection circuits 32 are contained within the I/O cells 33. Overlay cells are used to vary the number of ESD protection circuits 32 per I/O 33 cell and to accommodate wiring channel/macrocell interconnects. Referring to FIG. 1, metal connections between a cell 12–22 and the power buss rings 24 and 26 should preferably be as close together as possible. There should be not more than the equivalent of two ohms of buss line metal (less than 40 squares) between the power and ground connections to the same cell. It is not allowed to connect the power and reference potential terminals of the same cell to opposite sides of the chip unless the power buss lines to the cell also run from one side of the chip to the other.

Figure 4:
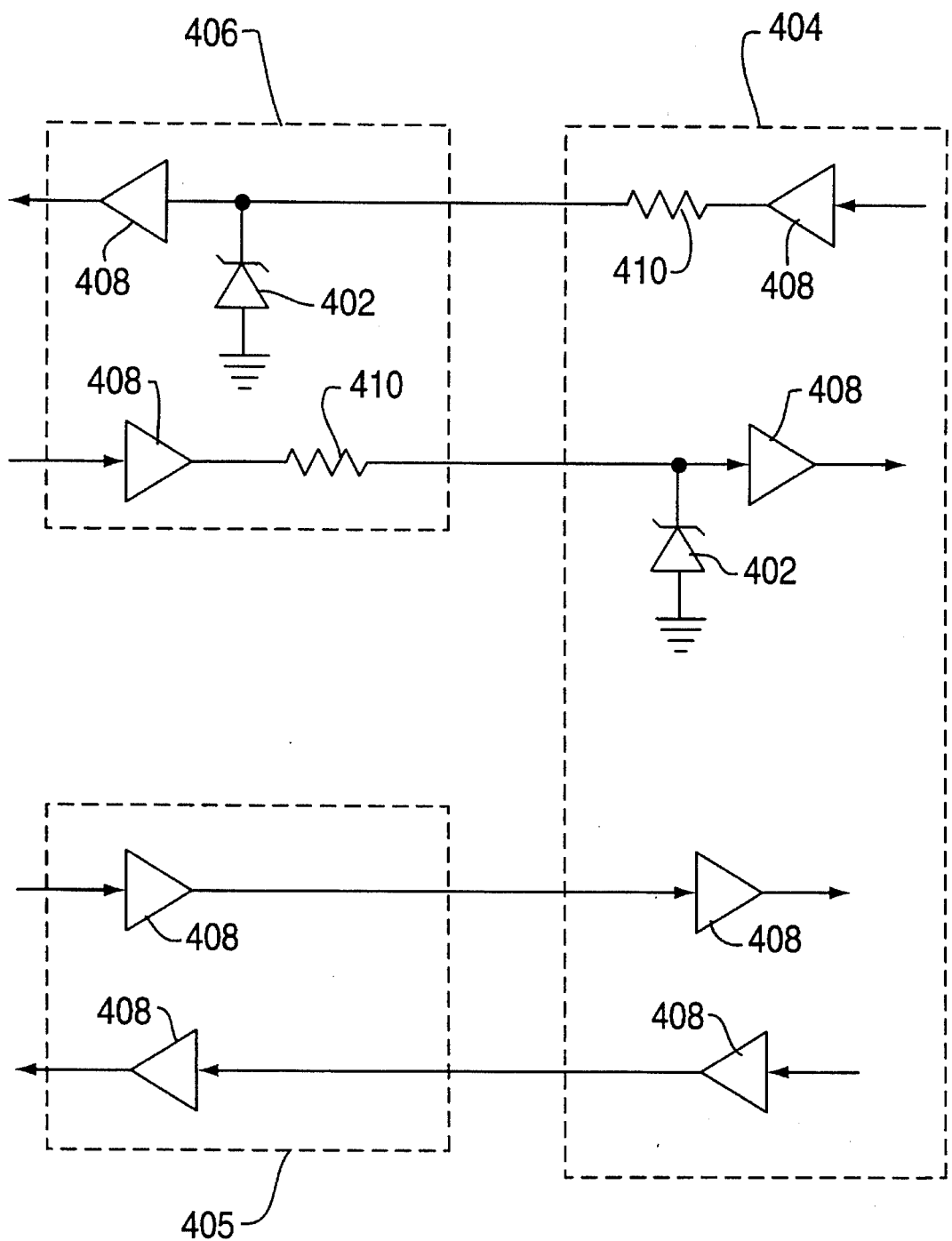
FIG. 4 is a schematic diagram illustrating an interface protection circuit between the core macrocells and the peripheral I/O pads.

During a transient event such as ESD it is possible to develop a significant voltage difference between or within the I/O cells around the periphery of the IC and the core macrocells. It is therefore necessary to provide interface protection for the gates of I/O cells and the macrocells at these interface points. Without the interface protection transient voltage between the internal reference potential buss line or the power buss lines can result in an excessive potential difference across the thin gate oxide of transistors damaging the transistors and causing cell malfunction. This is illustrated in FIG. 4. A small zener diode 402 is preferably included at the input to a core macrocell 404 which receives a drive signal from the peripheral I/O cell 406, and each I/O interface cell which receives a drive signal from a core macrocell. The zener should be placed as close to the actual input gate of the interface driver 408 as possible. The ground return should also be placed close to the source connection of the input device, preferably an NMOS transistor, to ensure the best possible clamping action. The resistor 410 in series with the output of the interface drivers may be placed anywhere suitable. However, for maximum flexibility and minimum engineering effort, it should be incorporated in the macrocells as shown in FIG. 4. Note that no special precautions are required when interfacing between one core macrocell 404 and another core macrocell 405.

Any ESD protection circuit may be used which is compatible with the cells being protected and the fabrication process used. The choice of the particular ESD circuit depending on that required for the type of cell which is to be protected by the ESD circuit 32 and the process used to fabricate the block of circuit cells. Alternative embodiments of a particular protection circuit useful for the ESD protection circuit 32 for macrocellblock circuits using 0.3 to 0.8 micrometer design rules are disclosed in my U.S. Pat. No. 5,343,053 and shown in FIGS. 5–7. This ESD protection circuit comprises an SCR having an electronic triggering means, preferably a zener diode, connected in parallel for turning the SCR on, and a zener diode in series with the SCR to control the "on-state" or clamping voltage.

The fabrication processes themselves are well known in the IC art. The incorporation of the power line protection circuits into the wiring channel/core power buss cell is best accomplished with a series of overlays. Each cell would need a minimum of one protection circuit, but its position within the cell could vary depending on wiring channel/core macrocellconnections. In practice, most cells would preferably incorporate two or three protection circuits to satisfy the total chip requirements of 2 to 3 millimeter width of the structures.

For core limited designs it will be necessary to use a stretchable cell between the pad cells that also includes the core power busses and wiring channel. Extra protection structures could be placed in the stretchable cells as required to make up the total quantity of required protection structures.

Isolated power busses, such as Vstandby which feeds the random access memory blocks, will need their own protection. For these situations, a minimum of 400 micrometers width of protection cells is preferred. These cells should be placed as close to the actual macrocells as possible (they could even be incorporated within the macrocell) while observing the two Ohm rule for power bus resistance between the Vstandby power buss and the source of reference potential.

Figure 5:
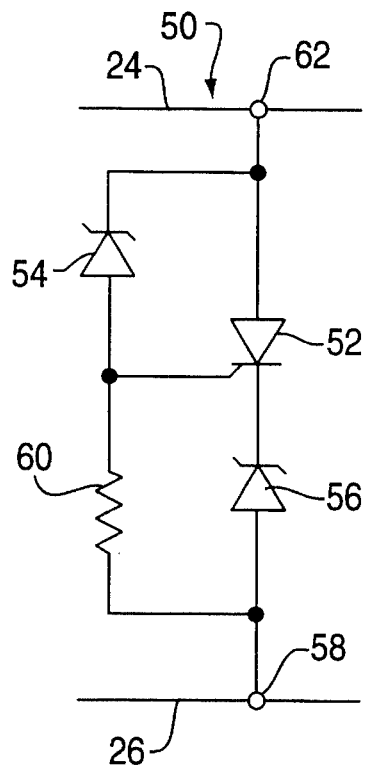
FIGS. 5–7 are schematic diagrams of ESD protection circuits useful in the practice of the invention.

In FIG. 5, an ESD protection circuit 50 useful for practicing the invention comprises an SCR 52 and a first zener diode 54 which is connected between the anode and gate of SCR 52. The diode 54 controls the trigger voltage of the SCR 52 so as to control the voltage at which the SCR 52 is switched to its "on" state. Connected to the cathode of the SCR 52 so as to be in series with the SCR 52 is a second zener diode 56. The cathode of the zener diode 56 is connected to the cathode of the SCR 52, and the anode of the zener diode 56 is connected to a first terminal 58. A resistor 60 is connected between the gate of SCR 52 and the terminal 58 and in series with the zener diode 54. The anode of the SCR 52 and the cathode of the zener diode 54 are connected to a second terminal 62. The zener diode 56 controls the "on-state" or clamping voltage of the SCR 52. The circuit 50 is a two terminal device with the terminals 58 and 62 being connected to the power lines 24 and 26 across which is also connected the macrocellblock, not shown, to be protected.

Figure 6:
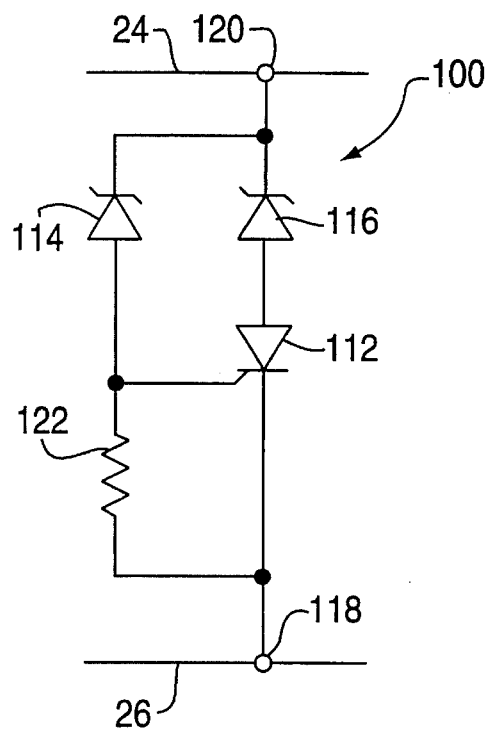

In FIG. 6, an alternative protection circuit 100 comprises an SCR 112, a first zener diode 114 in parallel with the SCR 112 and a second zener diode 116 in series with the SCR 112. The zener diode 116 is connected between the anode of the SCR 112 and a second terminal 120 with the anode of the zener diode 116 being electrically connected to the anode of the SCR 112. The cathode of the SCR 112 is connected to a first terminal 118, and the cathode of the zener diode 116 is electrically connected to the second terminal 120. The zener diode 114 is in parallel with the SCR 112 and with the zener diode 116 with the cathode of the zener diode 114 connected to the cathode of the zener diode 116 and the second terminal 120. A resistor 122 is connected in series between the anode of the zener diode 114 and the first terminal 118. The junction between resistor 122 and zener diode 114 is connected to the gate of SCR 112. The protection circuit 100 is also a two terminal device with the terminals 118 and 120 connected to the power lines 24 and 26. The circuit 100 is a two terminal device with the terminals 118 and 120 being connected to the power lines 24 and 26 across which is also connected the macrocellblock, not shown, to be protected.

Figure 7:
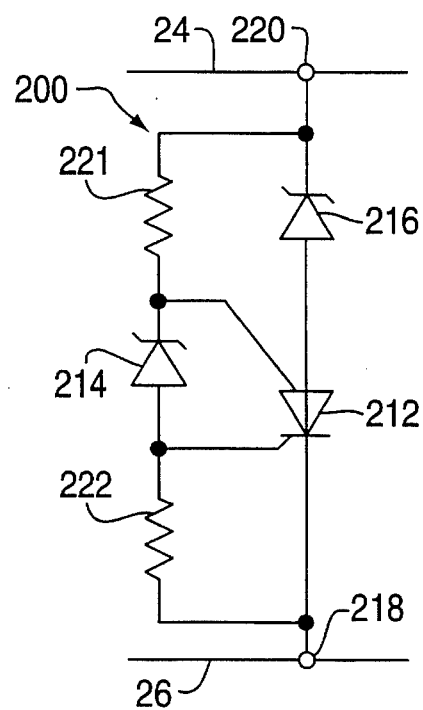

In FIG. 7, an alternative protection circuit 200 comprises an SCR 212, a first zener diode 214 in parallel with the SCR 212 and a second zener diode 216 in series with the SCR 212. The zener diode 216 is connected between the anode of the SCR 212 and a second terminal 220 with the anode of the zener diode 216 being connected to the anode of the SCR 212. The cathode of the SCR 212 is connected to a first terminal 218, and the cathode of the zener diode 216 is connected to the second terminal 220. The zener diode 214 is connected in parallel with the SCR 212. A resistor 221 is connected in series between the cathode of zener diode 214 and the second terminal 220. The junction of resistor 221 and zener diode 214 is connected to the second gate of SCR 212. A resistor 222 is connected in series between the anode of the zener diode 214 and the first terminal 218. The junction of resistor 222 and zener diode 214 is connected to the first gate of SCR 212. The circuit 200 is a two terminal device with the terminals 218 and 220 being connected to the power lines 24 and 26 across which is also connected the macrocellblock, not shown, to be protected.

In typical industrial practice, large logic blocks called macrocells are designed which are combined as appropriate to form the core logic of a dedicated integrated circuit (IC) function. When geometries shrink, manufacturers want to shrink the macrocells to make smaller ICs. The ESD protection circuits may change with different shrinks of the macrocells. If the ESD protection structures are added to each macrocell, substantial effort is necessary, and there is always a risk of inadvertently changing something in the design, causing an error. Also, changing the macrocells each time a shrink occurs, could cause the macrocells to grow, thus reducing the benefits of the shrink. Using the power ring approach of the invention allows maximum flexibility, reduces the effort required to add ESD protection to an array of macrocells, and can be done without affecting any macrocell. Thus the invention provides to a circuit, such as a core logic circuit or other similar array of macrocells, in which ESD protection circuits can be provided for each of the individual cells after the overall circuit has been designed. Also, it provides for the addition of the ESD protection circuits without substantially increasing the overall size of the circuit.

Modifications of the embodiments of the invention may occur to one skilled in the art. For example, while the exemplary embodiment has been described in terms of a power buss that extends about the array of individual cells, other arrangements of the power busses may be used. In addition, while the exemplary embodiment has been described in terms of a particular type of protection circuit, other protection circuits which are compatible with the circuits being protected and the processing technology are also within the scope of the invention. Such and like modifications are intended to be within the spirit and scope of the invention, and the appended claims.

I claim:

1. A circuit having electrostatic discharge (ESD) protection comprising:

a plurality of individual circuit cells electrically connected to one another, each circuit cell having an input-output connection (I/O pad);

a pair of conductive buss lines extending about the circuit cells;

means electrically connecting the circuit cells to the buss lines, and a plurality of ESD protection circuit positioned between and electrically connected between the buss lines in a spaced apart relationship.

2. The circuit of claim 1 in which the ESD protection circuits are arranged in spaced relation along the buss lines with one of the ESD protection circuits being connected to the buss lines in a close relationship to the I/O pad of one of the circuit cells.

3. The circuit of claim 2 in which the ESD protection circuits are arranged in spaced relation along the buss lines with at least one of the ESD protection circuits being positioned within and connected to the buss lines within the I/O pad structure of one of the circuit cells.

4. The circuit of claim 2 further comprising at least one interface protection circuit connected to the I/O pad of a circuit cell to provide ESD protection to the input and output connections of the circuit cell.

5. The circuit of claim 2 including at least one pair of power pads on the substrate with each of the power pads being electrically connected to a separate buss line.

6. The circuit of claim 5 including a plurality of pairs of power pads on the substrate and positioned in spaced apart relation along the buss lines, one power pad of each pair being electrically connected to one of the buss lines and the other power pad of each pair being electrically connected to the other buss line.

7. The circuit of claim 1 wherein the protection circuit comprises:

a silicon controlled rectifier (SCR);

an electronic triggering means for triggering the SCR to its on-state electrically connected in parallel with said SCR; and a first zener diode electrically connected in series with the SCR to control the clamping voltage of the SCR.

8. The circuit of claim 7 wherein the electronic triggering means comprises a second zener diode electrically connected in parallel with the SCR.

9. The circuit of claim 8 wherein the SCR has a cathode electrically coupled to a first terminal and an anode electrically coupled to a second terminal.

10. The circuit of claim 9 wherein the first zener diode is electrically coupled between the cathode of the SCR and the first terminal.

11. The circuit of claim 10 wherein the first zener diode has a cathode electrically coupled to the cathode of the SCR and an anode electrically coupled to the first terminal.

12. The circuit of claim 11 further comprising a resistor electrically coupled in series between the second zener diode and the first terminal; and wherein the second zener diode has a cathode electrically coupled to the anode of the SCR and the second terminal, and an anode electrically coupled to gate of the SCR.

13. The circuit of claim 9 wherein:

the first zener diode is electrically coupled between the anode of the SCR and the second terminal;

the first zener diode has an anode electrically coupled to the anode of the SCR and a cathode electrically coupled to the second terminal;

the second zener diode has a cathode electrically coupled to the second terminal and an anode electrically coupled to the first terminal;

a resistor electrically coupled in series between the anode of the second zener diode and the first terminal; and a second resistor electrically connected in series between the cathode of the second zener diode and the second terminal.

* * * * *